United States Patent [19]

Shiratani

[11] 4,430,753

[45] Feb. 7, 1984

[54] RADIO RECEIVER

[75] Inventor: Yuji Shiratani, Otsu, Japan

[73] Assignee: Mitsubishi Denki Kabushiki Kaisha, Tokyo, Japan

[21] Appl. No.: 285,440

[22] Filed: Jul. 21, 1981

[30] Foreign Application Priority Data

Jul. 24, 1980 [JP] Japan ............................. 55-102005
Aug. 4, 1980 [JP] Japan ............................. 55-108567
Oct. 20, 1980 [JP] Japan ............................. 55-147167

[51] Int. Cl.³ .................... H04B 1/16; H04B 17/00; H04B 3/60
[52] U.S. Cl. ................................. 455/52; 455/62; 455/165; 455/166
[58] Field of Search ............... 455/166, 52, 62, 161, 455/164, 165, 185, 186

[56] References Cited

U.S. PATENT DOCUMENTS

| | | | |
|---|---|---|---|
| 3,443,228 | 5/1969 | Brenner et al. | 455/62 |
| 4,069,455 | 1/1978 | Sherman, Jr. | 455/226 |
| 4,197,500 | 4/1980 | Klein | 455/62 |
| 4,253,194 | 2/1981 | Van Deursen | 455/161 |
| 4,365,347 | 12/1982 | Otsuka et al. | 455/52 |

FOREIGN PATENT DOCUMENTS 55-52627 4/1980 Japan ................................. 455/185

Primary Examiner—Marc E. Bookbinder
Attorney, Agent, or Firm—Wenderoth, Lind & Ponack

[57] ABSTRACT

A receiver which includes: a first memory including one set of nine data areas for storing frequency data for broadcast stations broadcasting a common broadcasting program at difference frequencies for each of a plurality of station selecting keys, a second memory including a first and a second data areas for storing the frequency data transferred from that set of data areas of the first memory selected by one of the keys, and a tuner tuned to a first broadcast station determined by the frequency data in the first data area of the second memory through a tuning voltage generator. By temporarily muting the first station, a second broadcast station is compared with the first station as to the average of the sensed reception level. This process is repeated with the frequency data in the selected set of the data areas of the first memory after their successive transfer to the latter. The tuner is then tuned to that station having a reception level which is higher than that of the first station. The tuning voltage generator may be formed of a PLL syntherizer having a variable bandwidth with the frequency data replaced by a ratio of the frequency division.

14 Claims, 2 Drawing Figures

RADIO RECEIVER

BACKGROUND OF THE INVENTION

This invention relates to a radio receiver comprising at least one station selecting key and a memory for storing tuning data for a plurality of broadcast stations for the one station selecting key or each of the station selecting keys.

Radio receivers comprising an electronic memory have been previously constructed so that the electronic memory stores tuning data for only a single broadcast station in the same broadcast band for each of a plurality of station selecting keys. This measure has been effective for fixed or stationary radio receivers because, by storing tuning data for broadcast stations giving the good reception status in areas where the receivers are located, for those station selecting keys, a good broadcast station can be always selected only through the single operation of selecting a station without offering any problem. For radio receivers equipped on a motor vehicle, however, a stored broadcast station may provide extremely deteriorated reception because of the fact that the motor vehicle has been moved out of its service area, resulting in the unavoidable necessity of selecting another broadcast station. As a range in which the motor vehicle is moved becomes large, the operation of selecting a broadcast station must be frequently performed, resulting in extremely troublesome receivers.

Accordingly, it is an object of the present invention to provide a new and improved radio receiver for a motor vehicle which, when the vehicle has been moved out of the service area of a broadcast station so as to result in a deteriorated reception of a broadcast program which has been broadcast by that broadcast station, automatically tunes to another broadcast station which broadcasts the identical program but is different in frequency from the firstmentioned broadcast station, thereby receiving the identical broadcast program from the lastmentioned station.

SUMMARY OF THE INVENTION

The present invention provides a radio receiver arranged during the movement thereof to selectively receive a common broadcasting program from a plurality of scattered broadcast stations broadcasting the common broadcasting program at different frequencies respectively, wherein there are provided means for temporarily exchanging the reception of a first one of the broadcast stations having the broadcasting program now received by the receiver with the reception of a second one of the broadcast stations not now received by the receiver during the reception of the first broadcast station, and a means for receiving the common broadcasting program from which of the first and second broadcast stations is higher in its reception level.

In a preferred embodiment of the present invention, the radio receiver may comprise a command station selecting means for instructing the reception of the common broadcasting program, a frequency data memory means for storing preliminarily frequency data of at least two of the broadcast stations, a tuner means, a first tuning control means responsive to the instructions from the command station selecting means to tune the tuner means to a first one of the broadcast stations having a first one of the frequency data stored in the frequency data memory means, a second tuning control means for tuning the tuner means to a second one of the broadcast stations having a second one of the frequency data stored in the frequency data means for a relatively short time interval when the tuner means is tuned to the first broadcast station, a level comparison means for comparing a first reception level at which the tuner means is tuned to the first broadcast station with a second reception level at which the tuner means is tuned to the second broadcast station, and a third tuning control means for changing the tuning of the tuner means from the first to the second broadcast station in response to the second reception level being in excess of the first reception level as determined by the level comparison means.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
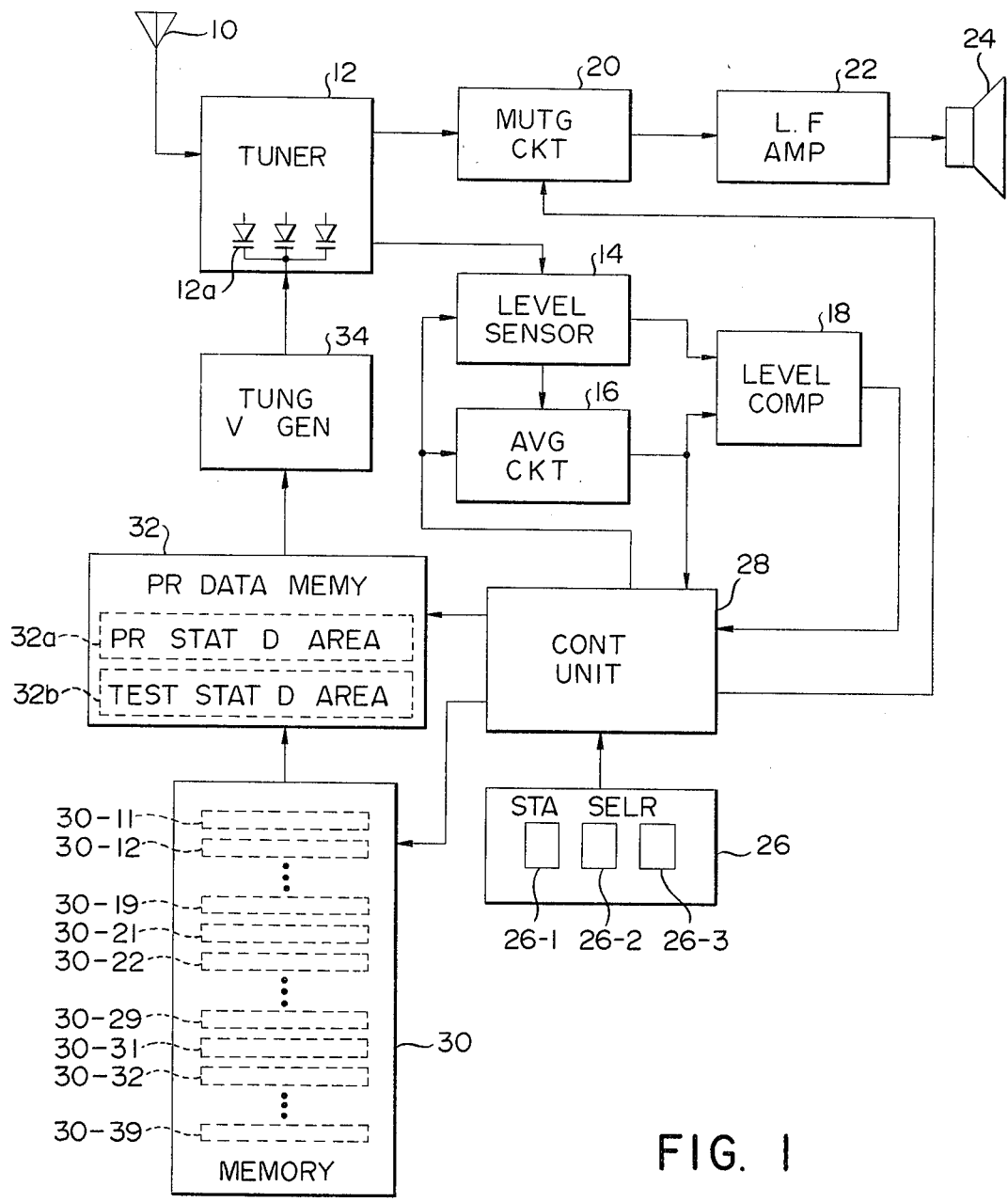
FIG. 1 is a block diagram of one embodiment according to the radio receiver of the present invention.

Referring now to FIG. 1 of the drawings, there is illustrated one embodiment according to the radio receiver of the present invention. The illustrated arrangement comprises an antenna 10 which is connected to a tuner 12 and supplies received signals to the latter. One portion of that signal tuned by the tuner 12 is supplied to a level sensor circuit 14 serving as received level sensor means. An output from the lever sensor circuit 14 is applied to one input of both an averaging circuit 16 and a level comparison circuit 18. The level sensor circuit 14 is operative to sense a received level of a signal or a broadcasting program from a broadcast station to which the tuner 12 is tuned and to quantize the second level into one of a plurality of predetermined level ranges so that the level sensor circuit 14 periodically senses that level range within which a reception level lies and stores the sensed quantized level therein. An averaging circuit 16 averages a plurality of the reception levels stored in the level sensor circuit 14. The average reception level thus provided is then stored in the averaging circuit 16 as a reception level for a first broadcasting station which is broadcasting the broadcasting program which is now tuned by the tuner 12. Such a broadcast station is called hereinafter the "present broadcast station".

The level sensor circuit 14 and the averaging circuit 16 may be formed of a time constant circuit including a resistor and a capacitor to sense a reception level accumulated and averaged in analog manner.

The remaining portion of the signal tuned by the tuner 12 is applied via a muting circuit 20 to a low frequency amplifier 22 where it is amplified. The amplified signal is supplied to a loudspeaker 24 where it is converted to an audio output. The arrangement further comprises a station selector 26 including a plurality of station selecting keys, in this case, three keys 26-1, 26-2, 26-3 serving as command station selecting means to instruct the reception of the broadcasting program, and a control unit 28 connected to the other inputs to the level sensor circuit 14 and the averaging circuit 16 and also to the muting circuit 20. The averaging circuit 16 and the level comparison circuit 18 have their respective outputs connected to the control unit 28. The control unit 28 is connected to both a memory 30 means and another memory 32.

The memory 30 includes a plurality of data areas having stored therein at least two frequency data required for the same broadcasting programs to be received. In the illustrated example, the memory 30 includes the data areas 30-11, 30-12, ..., 30-19, the data areas 30-21, 30-22, ..., 30-29 which are respectively and the data areas 30-21, 30-32, ..., 30-39 alloted to the station selecting keys 26-1, 26-2 and 26-3 in the station selector 26. Thus, the memory 30 can store therein at most nine broadcast stations which are broadcasting the same program at different frequencies for each of the station selecting keys 26-1, 26-2 or 26-3 in the station selector 26. For example, if the station selecting key 26-1 is selected, then the station selector 26 supplies a program selecting signal originating from the station selecting key 26-1 to the control unit 28. Then, the control unit 28 causes the memory 30 to transfer frequency data stored in any of data areas 30-11 through 30-19, as determined by the program selecting signal, to the memory 32 which is called hereinafter a "present data memory".

In the illustrated example, frequency data first transferred to the present data memory 32 is that data lastly received by selecting the station selecting key 26-1 just precedingly because the latter frequency data can easily be stored in the control unit 28. The frequency data for the present broadcast station are transferred to a present station-data area 32a of the present data memory 32 while at the same time, frequency data following the now transferred frequency data is transferred to a testing station data area 32b thereof. For example, when the frequency data for the present broadcast station results from the data area 30-11 of the memory 30, frequency data stored in the data area 30-12 thereof is transferred to the testing station data area 32b of the present data memory 32.

The present data memory 32 subsequently delivers the present station data stored in the present station data area 32a to a tuning voltage generator 34. The tuning voltage generator 34 generates an output voltage in response to the present station data applied thereto and applies the output voltage to three variable capacitance diodes 12a shown in FIG. 1 as being disposed in the tuner 12.

In operation, the tuning voltage generator 34 first generates a tuning voltage as determined by the frequency data stored in the data area 32a of the present data memory 32 and then applies it to the tuner 12 as described above. As a result, the tuner 12 responds to the tuning voltage to be tuned to the present broadcast station and receive a broadcasting program therefrom. Thus, a control is effected which is responsive to the instruction from the control unit 28 to supply the frequency data stored in the data area 32a of the present data memory 32 to the tuning voltage generator 34, so as to thereby tune the tuner 12 to the present station corresponding to the frequency data stored in the data area 32a of the memory 32. The broadcast program or a signal from the present station received by the tuner 12 is applied to the level sensor circuit 14 which also receives one pulse of a pulse train having a pulse width of a few milliseconds for each second, said pulse train coming from the control unit 28. The level sensor circuit 14 senses a reception level between each pair of adjacent pulses and applies a sensed level signal to the averaging circuit 16. The averaging circuit 16 accumulates and averages the reception levels in accordance with pulses from the abovementioned pulse train applied thereto. The averaged reception level is supplied to both the level comparison circuit 18 and the control unit 28. The comparison circuit 18 determines if the averaged reception level is not higher than a predetermined magnitude. If so, the control unit 28 is operated to examine the reception status for a second broadcast station at predetermined time periods. The second broadcast station is called hereinafter a "tested broadcast station".

More specifically, the control unit 28 supplies the pulse train as described above to the muting circuit 20 to attenuate and mute an output level of a voice signal from the latter. That is, the loudspeaker 24 is muted.

Following this, the present data memory 32 is operated to exchange the frequency data stored in the present station data area 32a with those stored in the tested station data area 32b so as to thereby supply the frequency data originally stored in the tested station data area 32b to the tuner 12 through the tuning voltage generator 34. Thus, the tuner 12 is tuned to frequency contained in the frequency data supplied thereto to receive a broadcasting program sent at that frequency. Accordingly, a control is effected which is responsive to the instruction from the control unit 28 to exchange the frequency data for the present station with those for the tested station for a relatively short time interval during the reception of the present station so as to thereby tune the tuner 12 to the tested station. That program is the same as that from the present station. Then, the level sensor circuit 14 senses a reception level of the now received program in the same manner as described above and applies the sensed reception level to the comparison circuit 18. Then, the comparison circuit 18 compares the now sensed reception level with the reception level of the present station stored in the averaging circuit 16 between each pair of adjacent pulses with the extremely short pulse width applied from the control unit 28. The result of the comparison is applied to the control unit 28.

More specifically, when the tested station has a lower reception level than the present station, as determined by comparison circuit 18, the present data memory 32 is again operated to exchange the frequency data stored in the present station data area 32a with those stored in the tested station data area 32b and the control circuit 28 interrupts to supply the pulse train to the muting circuit 20 to release the muting of voice. Simultaneously, the memory 30 transfers frequency data stored in the next succeeding data area, for example, the data area 30-13 to the tested station data area 32b of the present data memory 32. After the lapse of one second, for example, the control unit 28 supplies again the pulse to the muting circuit 20 to mute voice. At that time the tuner 12 receives that broadcast station corresponding to the frequency data transferred to the tested station data area 32b followed by the determination of the reception level therefor as described above.

If the tested station has a lower reception level than the present station, as determined by the comparison circuit 18, then frequency data stored in the tested station data area 32b of the present data memory 32 is successively exchanged with those stored in the remaining data areas 30-14, 30-15, . . . , 30-19 of the memory 30 and the resulting reception levels are sensed as described above. It is now assumed that one tested station has a higher reception level than the present station as determined by the comparison circuit 18 as described above. Under the assumed conditions, the control unit 28 sense an output from the comparison circuit 18 and releases the muting of the voice without exchanging the frequency data stored in the present station data area 32a with those stored in the tested station data area 32b. Thus a control is effected which is responsive to the instruction from the control unit 28 and also to a tested station having a higher reception level than the present station to exchange the frequency data for the present station with those for the tested station in the present data memory 32 so as to thereby tune the tuner 12 to the tested station. In this way, the arrangement of FIG. 1 continues to receive the broadcasting program from that tested station having the higher reception level as the new present station. At that time, since the frequency data for the present station which has broadcasted the broadcasting program received by the tuner 12 up to that time, that frequency data is exchanged with those stored in the next succeeding data area of the memory 30.

In this way, the broadcasting program now received can be exchanged with that having the higher reception level in succession.

With the station selecting key 26-1 being selected, a broadcasting program first received is preferably what is best received among a plurality of the same broadcasting programs from broadcast stations whose frequency data are stored in those data areas of the memory 30 operatively associated with the station selecting key 26-1. To this end, it is only necessary to successively receive the same broadcasting programs concerning frequency data stored in the data areas 30-11 through 30-19 of the memory 30 in response to the operation of the station selecting key 26-1, for example, and determine the present station which is broadcasting the broadcasting program giving the highest reception level. More specifically, the control unit 28 may apply a train of pulses having the pulse width of from scores of milliseconds to about 500 milliseconds to the muting circuit 20. Then, the frequency data stored in the data areas 30-11 through 30-19 of the memory 30 are successively transferred to the present data memory 32 and the tuning voltage generator 34 generates and applies tuning voltages to the tuner 12 one after another. The tuner 12 thereby successively receives the broadcasting programs with those frequency data while the level sensor circuit 14 senses that broadcast station giving the highest reception level and the averaging circuit 16 averages that highest reception level to determine the present broadcast station.

Also, the listener does not feel strange at the instant the broadcast station is selected though the muting would be of a time interval ranging from scores of milliseconds to about 500 milliseconds. Therefore, the averaging circuit 16 may act as a memory circuit for storing a reception status resulting from the present broadcast station in the process as described above while testing in a general way the tested stations whose frequency data are stored in those data areas associated with a selected one of the station selecting keys by exchanging those tested stations with one another. At the completion of the test, the muting is released. This is equivalent to a null time period at which other broadcast stations are tested. It is apparent that the present station is that broadcasting station giving the best reception status.

The process of testing all the station at a stretch may be effectively conducted when the reception of the present broadcast station has been abruptly deteriorated.

The tested broadcast stations may also be tested in any of the following manners: For example, only the reception level for the present broadcast station may be sensed at predetermined constant time periods and when the reception level of the present broadcast station reduces abruptly, a reception level for a tested broadcast station is sensed. When that tested station has a higher reception level than the present station, the broadcasting program from the tested station is received.

Also, the reception levels for a plurality of tested broadcast stations other than the present broadcast station may be normally sensed at predetermined constant time periods and frequency data for that tested station giving the highest reception level are stored in the tested station data area 32b of the present data memory 32. When the reception level of the present broadcast station abruptly decreases, the same is changed to that tested broadcast station giving the highest reception level.

Furthermore, when the present broadcast station has a reception level which is lower than a tested broadcast station by a predetermined magnitude, that tested broadcast station may be utilized as the present broadcast station.

Furthermore, the listener may frequently not wish to hear a broadcasting program from a broadcast station at a particular time, even though that station is being received at the highest reception level. For example, that station may broadcast local news which the listener doesn't wish to be heard. In order to change the tuning of such a broadcast station, an operating key may be separately disposed on the station selector 26 so that the operation of the operating key results in the reception of the desired broadcasting program from that broadcast station giving a reception level which is second to the highest from among the broadcast stations having frequency data stored, for example, in the data area 30-11 through 30-19 of the memory 30.

In addition, the comparison of the reception level may be effected as follows: During the reception of a broadcasting program from the present broadcast station selected at will from a plurality of broadcast stations having frequency data stored in that set of data areas of the memory 30 associated with a selected one of the station selecting keys in the station selector 26, the reception level of the present broadcast station is successively compared with the reception levels of the remaining broadcast stations whose frequency data are stored in the abovementioned set of data areas and whose broadcasting programs are not now received and periodically at time periods dependent upon the reception level for the present broadcast station through the temporary exchange of the received broadcast stations. Those time periods are long with a high reception level for the present station and short with a low reception level therefor.

Figure 2:
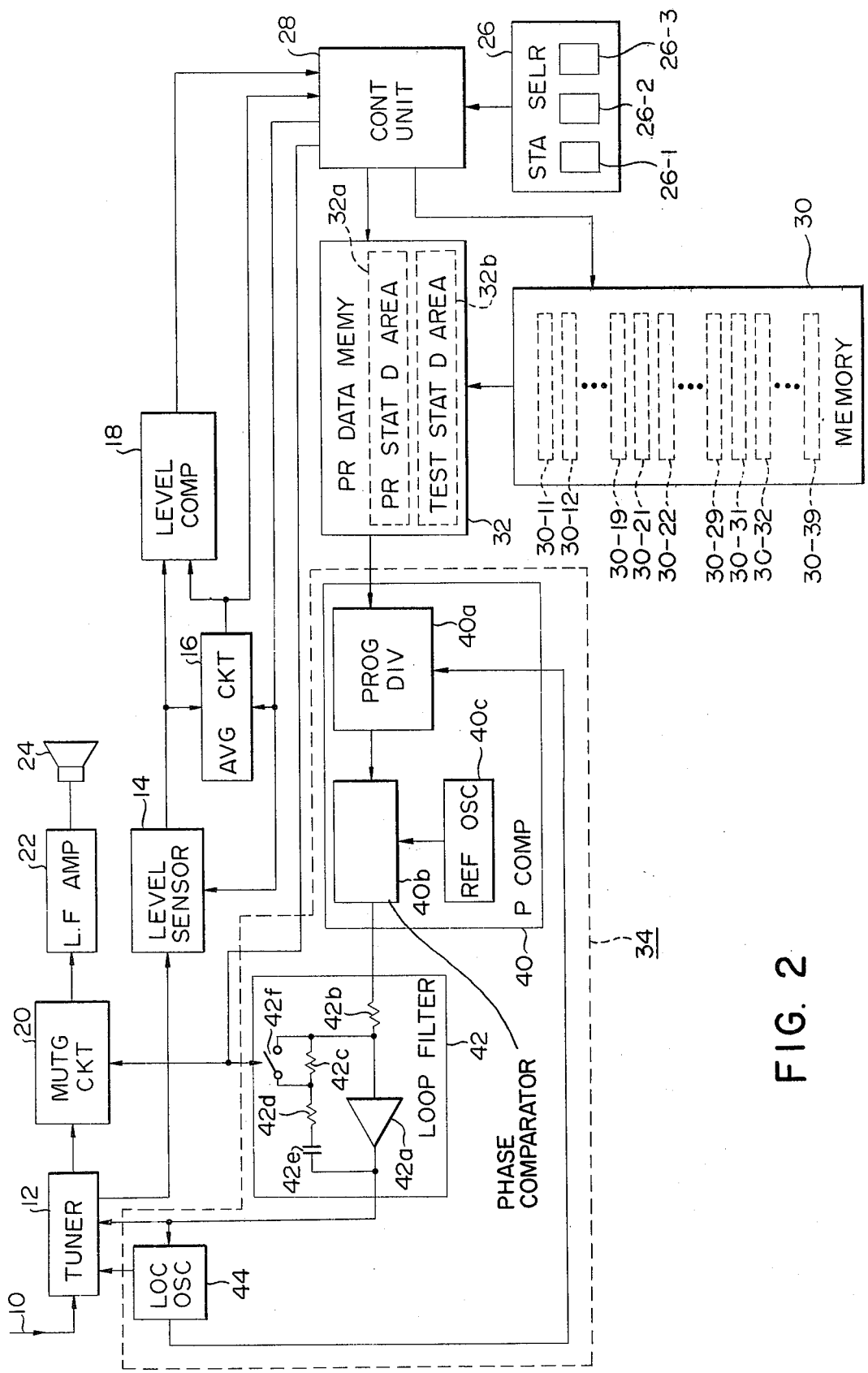
FIG. 2 is a combined block and circuit diagram of a modification of the present invention wherein the tuning voltage generator shown in FIG. 1 is replaced by a phase locked loop synthesizer having the details illustrated in a combined block and circuit view.

Referring now to FIG. 2 wherein like reference numerals designates the components identical or corresponding to those shown in FIG. 1, there is illustrated a modification of the present invention. The illustrated arrangement is different from that shown in FIG. 1 only in that in FIG. 2 a phase locked loop (which is abbreviated as "PLL") type synthesizer is substituted for the tuning voltage generator 34 shown in FIG. 1. The PLL synthesizer is generally designated also by the reference numeral 34 and comprises a phase comparator which is generally designated by the reference numeral 40 and which is connected to the present data memory 32, a loop filter generally designated by the reference numeral 42 connected to the phase comparator 40, and a local oscillator 44 connected to the loop filter 42.

The phase comparator 40 includes a programable divider 40a and a phase comparator 40b connected to both the programable divider 40a and a reference oscillator 40c. The reference oscillator 40c may be formed of a quartz oscillator having a stable oscillation frequency.

The loop filter 42 includes an operational amplifier 42a connected at the input to the phase comparator 40b in the phase comparator 40 through a resistor 42b and a feedback network composed of resistors 42c and 42d and a capacitor 42e connected in series to one another between the input and output of the operational amplifier 42a with the resistor 42c connected across an analog switch 42f controlled by the control unit.

The analog switch 42f can be closed and opened to remove and insert the resistor 42c from and into the feedback network so as to thereby change the bandwidth of the loop filter 42. In the illustrated example, the analog switch 42f is closed to narrow the bandwidth used in receiving the broadcasting program from the present broadcast station while it is opened to broaden the bandwidth used in receiving the broadcasting program from a tested station exchanged with the present station.

The output of the operational amplifier 42a is connected at the to both the tuner 12 and the local oscillator 44 which is, in turn, connected to the tuner 12 and also to the programable divider 40a of the phase comparator 40. Thus, an output from the operational amplifier 42a is applied to the tuner 12.

Also in the illustrated example, the frequency data stored in the memory 30 are in the form of ratios of frequency division. The present data memory 32 is operated to deliver the ratio of frequency division to the programmable divider 40a. In the PLL synthesizer 34, the phase comparator 40b supplies to a loop filter 42 an output which is proportional to a phase difference between a frequency from the programmable divider 40a and that from the reference oscillator 40c. The loop filter 42 removes noise from that output and applies a noise-free voltage output to the local oscillator 44 which, in turn, oscillates at a frequency corresponding to the voltage output and also feeds the frequency back to the programmable divider 40a. Through this feedback control, the local oscillator 44 supplies a frequency to the tuner 12 which is determined by the ratio of frequency division supplied to the programmable divider 40a after some time interval. Thus, the tuner 12 is stably tuned to the present broadcast station.

The control unit 28 also supplies the control signal to the analog switch 42f so as to maintain the latter in its OFF position to broaden the band width of the loop filter 42. Then, the level sensor circuit 14, the averaging circuit 16 and the comparison circuit 18 are operated with a delay time related to the stabilization time of the PLL circuit. With the control signal removed from both the muting circuit 20 and the analog switch 42f, the muting of the voice is released as in the arrangement of FIG. 1 while at the same time the analog switch 42f is put in its ON position to narrow the bandwidth of the loop filter 42 resulting in an increase in the signal-to-noise ratio.

In other respects, the arrangement of FIG. 2 is substantially identical in operation to that shown in FIG. 1.

The arrangement of FIG. 2 is advantageous over that shown in FIG. 1 in that, since the PLL synthesizer controls the tuner, the exchange of a received broadcasting station can be rapidly and stably accomplished by only transferring the ratio of frequency division in the memory to the programmable divider 40a. Furthermore, by temporarily broading the bandwidth of the loop filter, the reception level of a tested broadcast station can be learned within a short time interval without any interference from broadcast stations which are close in frequency thereto. Therefore, it is possible to learn the reception levels for the tested broadcast station from one minute to the next.

In summary, the present invention provides a radio receiver capable of continuing automatically to receive that broadcast station put in the best state by automatically changing the tuning from one to another of broadcast stations which are broadcasting a common broadcasting program at different frequency through the transfer of tuning data such as frequency data thereof contained within a memory. Therefore, when motor vehicles equipped with the radio receiver of the present invention are traveling so as to leave a service area of a broadcast station which is broadcasting a broadcasting program, which is now received by the receiver and enter that of another broadcast station which is broadcasting the identical program but having a different frequency from the firstmentioned station, the receiver is automatically changed to receive the latter station. This results in an ideal radio receiver which continuously and automatically receives the best broadcast station.

While the present invention has been illustrated and described in conjunction with a few preferred embodiments thereof, it is to be understood that nemerous changes and modifications may be resorted to without departing from the spirit and scope of the present invention.

What is claimed is:

1. A radio receiver arranged during the physical movement thereof to selectively receive a common broadcasting program from a plurality of scattered broadcast stations which are respectively broadcasting said common broadcasting program at different frequencies, said receiver comprising a means for temporarily exchanging a tuning of said receiver from a first one of said broadcast stations having said common broadcasting program and presently being received by said receiver to a second one of said broadcast stations having said common broadcasting program and not now presently being received by said receiver during the reception of said program from said first broadcast station, a means for comparing a reception level of said common broadcasting program of said first broadcast station with that of said second broadcast station, and a means for controlling said tuning of said receiver for receiving said common broadcasting program from the one of said first and second broadcast stations having a higher reception level;

wherein said means for exchanging said tuning of said receiver from said first broadcast station to said second broadcast station temporarily exchanges said tuning either for long time periods when said reception level for said first broadcast station is high or for short time periods when said reception level for said first broadcast station is low.

2. A radio receiver arranged during the physical movement thereof to selectively receive a common broadcasting program from a plurality of scattered broadcast stations which are respectively broadcasting said common broadcasting program at different frequencies, said receiver comprising a means for temporarily exchanging a tuning of said receiver from a first one of said broadcast stations having said common broadcasting program presently being received by said receiver to a second one of said broadcast stations having said common broadcasting program and not now presently being received by said receiver during the reception of said first broadcast station station, and a means for controlling said tuning of said receiver for receiving said common broadcasting program from the one of said first and second broadcast stations having a higher reception level;

said receiver further comprising a command station selecting means for providing an instruction for instructing the reception of said common broadcasting program, a frequency data memory means for preliminarily storing frequency data of at least two of said broadcast stations therein, said means for temporarily exchanging being responsive to said instruction from said command station selecting means for enabling said memory means to provide a first one of said frequency data to said tuning controlling means to tune said receiver to a first one of said broadcast stations corresponding to said first one of said frequency data stored in said frequency data memory means and for enabling said memory means to provide a second one of said frequency data to said tuning controlling means to tune said receiver to a second one of said broadcast stations corresponding to said second one of said frequency data stored in said frequency data memory means for a relatively short test time interval when said receiver is tuned to said first broadcast station, a level comparator means for comparing a first reception level when said receiver is tuned to said first broadcast station with a second reception level at which said receiver is tuned to said second broadcast station, said tuning exchanging means enabling said second one of said frequency data to be provided to said tuning controlling means to change the tuning of said receiver from said first to said second broadcast station in response to said second reception level being in excess of said first reception level as determined by said level comparator means.

3. A radio receiver as claimed in claims 1 or 2, further comprising a muting means which is enabled for a time interval required for said tuning of said receiver to be changed from said first broadcast station to said second broadcast station for muting an audio output of said receiver.

4. A radio receiver as claimed in claim 1 or 2, wherein said tuning controlling means comprises a PLL synthesizer for controlling said tuning of said receiver.

5. A radio receiver as claimed in claim 4, wherein said PLL synthesizer includes a loop filter having a variable bandwidth, said loop filter being responsive to the temporary or test change in tuning of said receiver to one of said broadcast stations broadcasting said common broadcasting program and not presently being received by said receiver so as to broaden said bandwidth of said loop filter as compared with normal reception so as to thereby reduce a pulling-in time of said PLL synthesizer.

6. A radio receiver as claimed in claim 2 wherein said tuning controlling means tunes said receiver to said second broadcast station for said relatively short test time intervals at predetermined constant time periods.

7. A radio receiver as claimed in claim 2 wherein said exchanging means is responsive to said first reception level being not greater than a predetermined magnitude so as to tune said receiver to said second broadcast station.

8. A radio receiver as claimed in claim 2 further comprising a reception level sensor means for sensing a selected one of said first and second reception levels when said receiver is tuned to a corresponding one of said first and second broadcast stations, and further comprising a reception level memory means for storing therein said first reception level sensed by said reception level sensor means.

9. A radio receiver as claimed in claim 8, wherein said reception level sensor means senses the average of said first reception levels.

10. A radio receiver as claimed in claim 8, wherein said reception level sensor means senses an instantaneous magnitude of said first reception level, and said reception level memory means stores therein said instantaneous magnitude of said first reception level, and said reception level comparator means compares said instantaneous magnitude of said first reception level stored in said reception level memory means with said second reception level, and said tuning exchanging means is responsive to said second reception level exceeding said instantaneous magnitude of said first reception level by a predetermined magnitude as determined by said reception level comparator means so as to change the tuning of said receiver to said second broadcast station.

11. A radio receiver as claimed in claim 2, wherein said frequency data memory means stores therein a plurality of frequency data of broadcast stations broadcasting said common program at different frequencies respectively, said exchanging means and tuning controlling means initially causing said receiver to be tuned to said broadcast stations having said respective frequency data stored in said frequency data memory means for relatively short time intervals one after another, said receiver further comprising a reception level sensor means which senses which of said broadcast stations gives a maximum reception level, said exchanging means and tuning controlling means causing said receiver to be tuned to the broadcast station giving the maximum reception level as sensed by said reception level sensor means, and said reception level sensor means further storing said maximum reception level sensed by said reception level sensor means as the reception level for said first broadcast station.

12. A radio receiver as claimed in claims 2 or 11, further comprising a muting means for controlling said receiver such that a voice output from said receiver corresponding to the broadcasting station to which said receiver is tuned is attenuated for a relatively short time interval.

13. A radio receiver as claimed in claim 10, wherein said frequency data memory means stores therein a plurality of frequency data of broadcast stations broadcasting said common program at different frequencies respectively, said exchanging means and tuning controlling means initially causing said receiver to be tuned to said broadcast stations having said respective frequency data stored in said frequency data memory means for relatively short time intervals one after another, and said reception level sensor means senses which of said broadcast stations gives a maximum reception level, said exchanging means and tuning controlling means causing said receiver to be tuned to the broadcast station giving the maximum reception level as sensed by said reception level sensor means, and said reception level sensor means further storing said maximum reception level sensed by said reception level sensor means as the reception level for said first broadcast station.

14. A radio receiver as claimed in claim 13, further comprising a muting means for controlling said receiver such that a voice output from said receiver corresponding to the broadcasting station to which said receiver is tuned for a relatively short time interval.

* * * * *